(12) United States Patent
Kim et al.

(10) Patent No.: US 7,714,326 B2
(45) Date of Patent: May 11, 2010

(54) ELECTRICAL ANTIFUSE WITH INTEGRATED SENSOR

(75) Inventors: Deok-kee Kim, Bedford Hills, NY (US); Hoki Kim, Hopewell Junction, NY (US); Chandrasekharan Kothandaraman, Hopewell Junction, NY (US); Byeongju Park, Plainview, NY (US); John M. Safran, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 654 days.

(21) Appl. No.: 11/683,075

(22) Filed: Mar. 7, 2007

(65) Prior Publication Data

US 2008/0217658 A1    Sep. 11, 2008

(51) Int. Cl.
*H01L 29/04* (2006.01)
*H01H 37/76* (2006.01)

(52) U.S. Cl. .................................. 257/50; 327/525
(58) Field of Classification Search .......... 365/163, 365/225.7; 257/525, 131, 530, 50, E23.147, 257/E23.149, 531, 532, 668; 327/525; 438/197
See application file for complete search history.

(56) References Cited

U.S. PATENT DOCUMENTS

| | | | |
|---|---|---|---|
| 4,914,055 A | 4/1990 | Gordon et al. | |
| 5,272,666 A | 12/1993 | Tsang et al. | |
| 5,412,593 A | 5/1995 | Magel et al. | |
| 5,469,396 A * | 11/1995 | Eltoukhy ............... | 365/210.1 |
| 5,621,691 A | 4/1997 | Park | |
| 5,903,041 A | 5/1999 | La Fleur et al. | |
| 6,096,580 A | 8/2000 | Iyer et al. | |
| 6,323,534 B1 | 11/2001 | Marr et al. | |
| 6,346,846 B1 * | 2/2002 | Bertin et al. ............. | 327/525 |
| 6,388,305 B1 | 5/2002 | Bertin et al. | |
| 6,396,120 B1 | 5/2002 | Bertin et al. | |

(Continued)

FOREIGN PATENT DOCUMENTS

WO    WO 2004/100271 A1    11/2004

(Continued)

OTHER PUBLICATIONS

C. Kothandaraman et al., "Electrically Programmable Fuse (eFUSE) Using Electromigration in Silicides", IEEE Electron Device Letters, vol. 23, No. 9, Sep. 2002, pp. 523-525.

(Continued)

*Primary Examiner*—Lynne A Gurley
*Assistant Examiner*—Galina Yushina
(74) *Attorney, Agent, or Firm*—Scully, Scott, Murphy & Presser, P.C.; Joseph P. Abate, Esq.

(57) ABSTRACT

The present invention provides structures for antifuses that utilize electromigration for programming. By providing a portion of antifuse link with high resistance without conducting material and then by inducing electromigration of the conducting material into the antifuse link, the resistance of the antifuse structure is changed. By providing a terminal on the antifuse link, the change in the electrical properties of the antifuse link is detected and sensed. Also disclosed are an integrated antifuse with a built-in sensing device and a two dimensional array of integrated antifuses that can share programming transistors and sensing circuitry.

20 Claims, 9 Drawing Sheets

U.S. PATENT DOCUMENTS

| | | |
|---|---|---|
| 6,396,121 B1 | 5/2002 | Bertin et al. |
| 6,433,404 B1 | 8/2002 | Iyer et al. |
| 6,498,056 B1 | 12/2002 | Motsiff et al. |
| 6,512,284 B2 | 1/2003 | Schulte et al. |
| 6,570,207 B2 | 5/2003 | Hsu et al. |
| 6,570,805 B2 * | 5/2003 | McCollum .............. 365/225.7 |
| 6,577,156 B2 | 6/2003 | Anand et al. |
| 6,617,914 B1 | 9/2003 | Kothandaraman |
| 6,621,324 B2 | 9/2003 | Fifield et al. |
| 6,624,031 B2 | 9/2003 | Abadeer et al. |
| 6,624,499 B2 | 9/2003 | Kothandaraman et al. |
| 6,661,330 B1 | 12/2003 | Young |
| 6,750,530 B1 | 6/2004 | Klaasen et al. |
| 6,751,137 B2 | 6/2004 | Park et al. |
| 6,753,590 B2 | 6/2004 | Fifield et al. |
| 6,794,726 B2 | 9/2004 | Radens et al. |
| 6,853,049 B2 | 2/2005 | Herner |
| 6,879,021 B1 | 4/2005 | Fitfield et al. |
| 6,882,027 B2 | 4/2005 | Brintzinger et al. |
| 6,927,997 B2 | 8/2005 | Lee et al. |
| 6,944,054 B2 | 9/2005 | Rueckes et al. |
| 6,972,614 B2 | 12/2005 | Anderson, II et al. |
| 7,087,499 B2 | 8/2006 | Rankin et al. |
| 7,102,951 B2 * | 9/2006 | Paillet et al. .............. 365/225.7 |
| 2004/0004268 A1 | 1/2004 | Brown et al. |
| 2005/0247997 A1 | 11/2005 | Chung et al. |
| 2006/0102982 A1 | 5/2006 | Park et al. |
| 2006/0278932 A1 | 12/2006 | Kothandaraman et al. |

FOREIGN PATENT DOCUMENTS

| | | |
|---|---|---|
| WO | WO 2006/028946 A2 | 3/2006 |

OTHER PUBLICATIONS

U.S. Appl. No. 11/307,785, entitled, "System and Method for Increasing Reliability of Electrical Fuse Programming", filed Feb. 22, 2006, to Byeongju Park et al.

U.S. Appl. No. 11/462,070, entitled, "Anti-Fuse Structure Optionally Integrated With Guard Ring Structure", filed Aug. 3, 2006, to James W. Adkisson et al.

U.S. Appl. No. 11/366,879, entitled, "Programmable Anti-Fuse Structures, Methods for Fabricating Programmable Anti-Fuse Structures, and Methods of Programming Anti-Fuse Structures", filed Mar. 2, 2006, to Louis C. Hsu.

U.S. Appl. No. 11/161,320, entitled, "Doped Single Crystal Silicon Silicided eFUSE", filed Jul. 29, 2005, to William R. Tonti et al.

U.S. Appl. No. 11/266,740, entitled, "eFUSE and Methods of Manufacturing the Same", filed Nov. 3, 2005, to William R. Tonti et al.

* cited by examiner

ELECTRICAL ANTIFUSE WITH INTEGRATED SENSOR

FIELD OF THE INVENTION

The present invention relates to a semiconductor memory device, and particularly, to semiconductor antifuse structures.

BACKGROUND OF THE INVENTION

Many types of semiconductor fuses and antifuses are known in the art. Both the fuses and antifuses utilize the change in resistance of the individual structure under certain bias conditions. Once programmed, the programmed state of the fuses or antifuses does not revert to the original state on its own; that is, the programmed state of the fuse or the antifuse is not reversible. Thus, fuses and antifuses are conducive to the manufacture of a programmable read only memory (PROM). Programming or lack of programming constitutes one bit of stored information in fuses or antifuses. The difference between fuses and antifuses is the way the resistance of the memory element is changed during the programming process. Semiconductor fuses have a low initial resistance state that may be changed to a higher resistance state through programming, i.e., through electrical bias conditions applied to the fuse. In contrast, semiconductor antifuses have a high initial resistance state that may be changed to a low resistance state through programming.

Various methods of implementing antifuses in semiconductor structures have been disclosed in the prior art. In general, antifuses include one insulating layer sandwiched between two electrically conducting structures. In some cases, the insulating layer is a dielectric layer such as silicon dioxide, silicon nitride, or a stack comprising silicon nitride layers and silicon dioxide layers such as an oxide/nitride/oxide (ONO) stack. Most of the antifuses are built sequentially such that each of the three components of the antifuse, i.e., the first electrically conducting structure, the insulating layer, and the second conducting structure, is built one on top of another. In this case, the sequential building of the antifuse components results in a vertical structure for the physical implementation of an antifuse. By supplying a large voltage difference across the two electrically conducting structures, a dielectric breakdown is induced and a current path between the two electrically conducting structures is formed, whereby the high resistance state of the antifuse changes to a low resistance state. Various materials may be used for each of the two electrically conducting structures. Improvements upon the basic structure are known in the prior art. As one example, U.S. Pat. No. 6,853,049 utilizes a silicide for one electrically conducting structure and polysilicon for the other electrically conducting structure. As another example, U.S. Pat. No. 6,750,530 provides a mechanism for lowering the antifuse programming voltage by providing a resistive heating element adjacent to, but not in contact with the antifuse.

Other antifuses utilize a layer other than a dielectric layer for the insulating layer. U.S. Pat. No. 5,272,666 provides one example of such a prior art where polysilicon is utilized as the insulating layer. Also, U.S. Pat. No. 4,914,055 discloses another prior art where amorphous silicon is utilized as the insulating layer. U.S. Pat. No. 6,512,284 discloses a structure where one of the two electrically conducting structures comprises a heater and two terminals for providing current through the heater.

Antifuses in the prior art typically require breakdown of dielectrics by electrical bias and/or heat. While these mechanisms offer reasonable reliability of operation, further improvement in the reliability of antifuse operation is desired. An antifuse element that provides improved reliability in programming is therefore desired. Furthermore, arrays of electrical antifuses and fuses require a sensing circuitry to sense the state of an individual antifuse element or fuse element. In the prior art, the sensing circuitry is typically built externally around an array of antifuses or fuses. This type of external sensing circuitry typically requires transistors of substantial size to handle large current and voltages through the wire connections of the array and to insure sufficient signal development during sensing operations. Incorporating a sensing mechanism into the antifuse structure would provide a more compact memory element with a less stringent requirement for current and voltage during sensing. Therefore, an antifuse structure with a built-in sensing mechanism is also desired.

SUMMARY OF THE INVENTION

The present invention addresses the need for improved reliability of antifuse programming by utilizing an electromigration mechanism of a conducting material, preferably, a silicide.

According to a first embodiment of the present invention, an antifuse structure is disclosed, which comprises a cathode, an antifuse link, and an anode. An antifuse link is constructed between a cathode and an anode of an antifuse such that the middle portion of the antifuse link consists of semiconductor material while two end portions abutting the middle portion is a stack comprising a semiconductor material and a conducting material. Preferably, the stack consists of a semiconductor material in the lower portion and a silicide in the upper portion of the stack. Most preferably, the semiconducting material is made of undoped silicon, doped silicon, undoped germanium, doped germanium, undoped alloy of silicon germanium, doped silicon germanium alloy, undoped silicon carbon alloy, doped silicon carbon alloy, undoped silicon germanium carbon alloy, or doped silicon germanium carbon alloy. Also, most preferably, the conducting material comprises a metal silicide, a metal germanide, or a mixture of a metal silicide and a metal germanide.

The cathode and anode have low resistance and conducts electricity. The absence of conducting material in the middle portion of the antifuse link raises the resistance of the antifuse link about 10~1000 times that of the cathode or anode. The resistance of the antifuse link is tunable by adjusting the doping of the semiconducting material or the dimensions of the middle portion of the antifuse link.

Figure 2A:
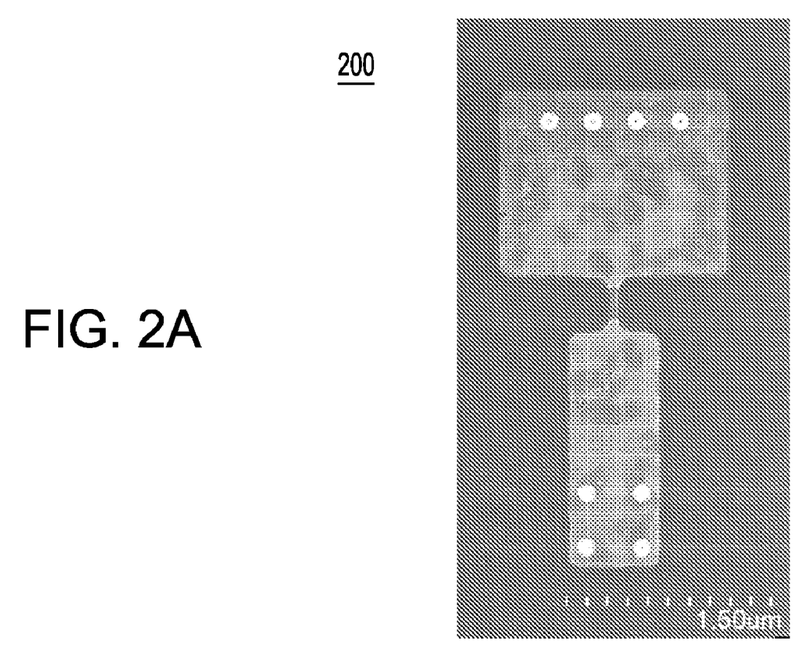
FIG. 2A is a top-down scanning electron micrograph (SEM) 200 of an intact electrical antifuse disclosed in the first embodiment of this invention.
Figure 2B:
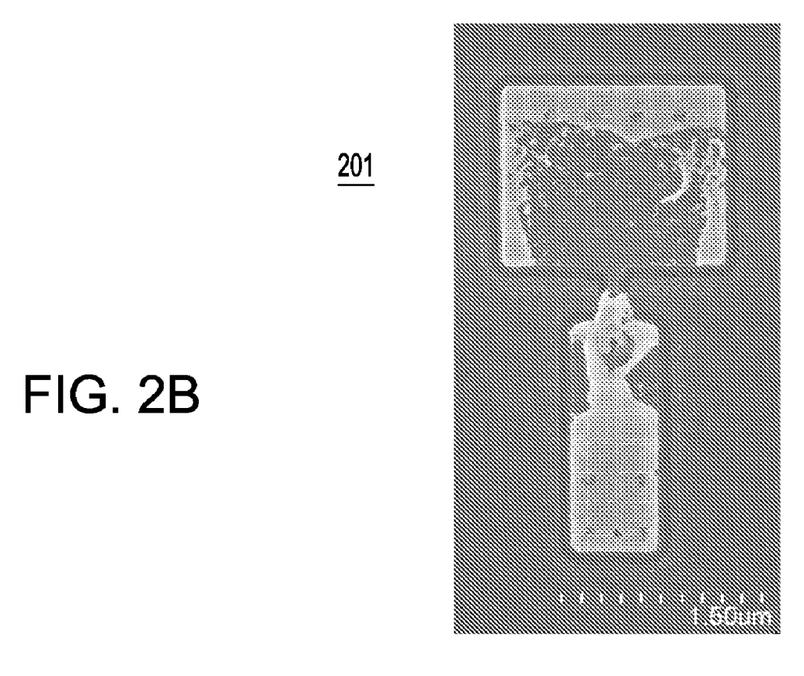
FIG. 2B is a top-down scanning electron micrograph (SEM) 201 of a programmed electrical antifuse disclosed in the first embodiment of this invention.

It has been demonstrated that electromigration can be induced on this type of antifuse structure under suitable electrical bias conditions. FIG. 2A and FIG. 2B provide an example of a successful induction of electromigration in one of the devices manufactured according to this invention. Furthermore, it has been demonstrated that the resistance change can be tuned either upward or downward depending on the voltage bias condition across the anode and the cathode of the inventive antifuse.

By modulating the amount of electromigrated material, it is possible to cause the electromigration of the conducting material, such as a metal silicide, such that about one half of the antifuse link is still filled with the conducting material, while the other half does not have any conducting material. The part of the antifuse link without the silicide is filled only with silicon material. As an example, not all of the conducting material that is electromigrated from the cathode of the antifuse goes through the antifuse link into the anode in the scanning electron micrograph (SEM) in FIG. 2B. Instead, a substantial portion of the electromigrating material stops adjacent to the anode but still within the antifuse link.

According to a second embodiment of this invention, an integrated antifuse is disclosed, which comprises an antifuse structure as disclosed in the first embodiment of this invention and a sensing device. The sensing device comprises a transistor with a drain, a source and a gate. The gate of the sensing device makes an electrical contact with the end portion of the antifuse link that adjoins the cathode.

In an intact integrated antifuse utilizing a silicide for the conducting material and doped silicon for the semiconducting material, the gate of the sensing device is electrically connected to the cathode since the resistance between the gate and the cathode is about 200 Ohms, while the resistance between the gate and the anode is about 5000 Ohms. The integrated antifuse may be programmed by supplying electrical bias between the anode and the cathode. To induce the electromigration of the conducting material from the cathode toward the anode, it is necessary that the voltage on the anode is positive relative to the voltage on the cathode.

During the programming process of an integrated antifuse, electromigrated conducting material fills a portion of the antifuse link that is adjacent to the anode as well as filling a portion of the anode. The programming conditions are adjusted such that the end of the portion of the antifuse link filled with the conducting material adjoins the part of the gate of the sensing device. Due to the presence of the conducting material between the anode and the gate of the sensing device, the electrical resistance between the anode and the gate is very low, that is, these two nodes are electrically connected after programming. Due to the electromigration of the conducting material, semiconducting material is present between the conducting material of the antifuse link and the cathode in the programmed integrated antifuse. In addition, a part of the cathode that is adjacent to the antifuse link is at this point filled only with semiconducting material and does not contain any conducting material. This material may or may not be doped with dopants. However, even if this volume of material is doped, the resistivity of this semiconducting material is much higher than that of any conducting material. Thus, the gate of the sensing device is electrically connected to the anode in the programmed antifuse.

In an integrated antifuse utilizing a silicide for the conducting material and doped silicon for the semiconducting material, the resistance between the anode and the gate is around 200 Ohms after programming. Typical resistance greater than 10,000 Ohms is achieved between the cathode and the anode in this way. Likewise, typical resistance greater than 10,000 Ohms is achieved between the gate and the cathode due to the presence of the silicon material without any conducting material.

According to a third embodiment of this invention, a two-dimensional integrated antifuse array is constructed by arranging multiple integrated antifuses as disclosed in the second embodiment of this invention in a row and column arrangement and by providing electrical connections among the nodes of individual integrated antifuses. Specifically, each of the anodes located in the same row are connected to one of row antifuse wiring lines nearby and each of the cathodes located in the same column are connected to one of column antifuse wiring lines. Also, each of the drains of the sensing devices in the same row are connected to one of row sensing device wiring lines nearby while each of the sources of the sensing devices in the same column are connected to ground through one of column sensing device wiring lines.

Furthermore, according to the third embodiment of this invention, the connection of voltage bias to various wiring lines may be provided with transistors in a peripheral circuitry. As an example, column antifuse wiring lines may be provided with column select transistors to selectively bias one of the many column antifuse wiring lines, that is, to select a particular column antifuse wiring line. Also, connection of the row antifuse wiring lines to the ground is controlled row by row with row grounding transistors. Likewise, selective biasing of the anodes on the selected row is accomplished through programming row enable transistors. Thus, by the combination of transistors in the periphery of the antifuse array, each antifuse can be uniquely addressed for programming. During sensing, one of the column select transistors selects one column of integrated antifuses while the rest of the column select transistors are turned off. The peripheral circuitry attached to the row sensing device wiring lines senses the state of the integrated antifuses within the selected column. Advantageously, the states of all the integrated antifuses in the same column are sensed simultaneously.

DETAILED DESCRIPTION OF THE INVENTION

As stated above, the present invention relates to semiconductor antifuse structures, which will now be described in greater detail by referring to the drawings that accompany the present application.

Figure 1A:
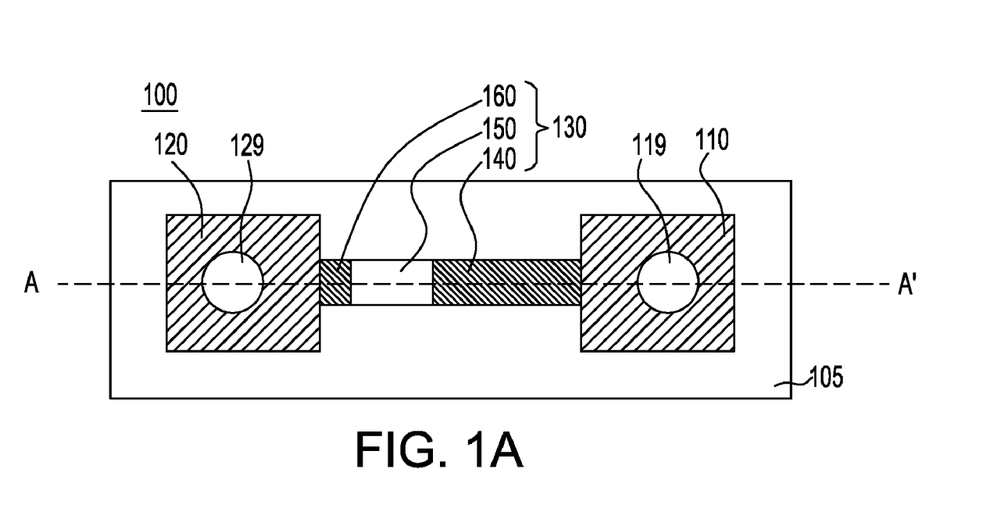
FIG. 1A is a top-down view 100 of an intact electrical antifuse as disclosed in the first embodiment of this invention.
Figure 1B:
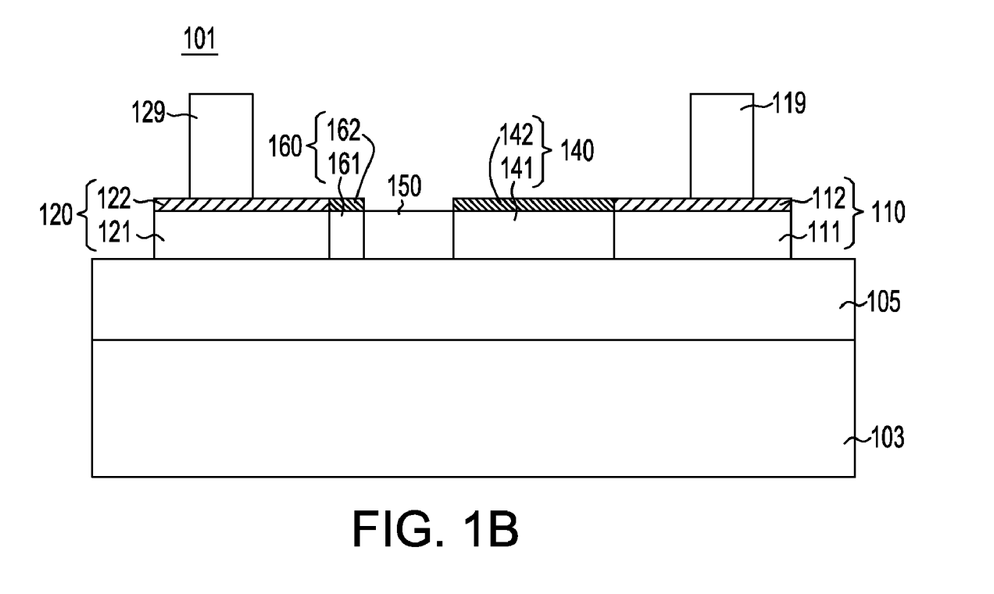
FIG. 1B is a cross-sectional view 101 along the plane A-A' in FIG. 1A of an intact electrical antifuse as disclosed in the first embodiment of this invention.

Referring first to FIGS. 1A and 1B, there is shown an intact antifuse structure 100 according to the first embodiment of this invention where an antifuse link 130 is adjoined by a cathode 110 on one side and adjoined by an anode 120 on another side. Preferably, the antifuse link 130, cathode 110, and anode 120 are formed on a shallow trench isolation 105 formed as an insulator on a semiconductor substrate 103. The antifuse link 130 comprises a portion 150 without conducting material and two conducting material containing portions. A first conducting material containing portion 140 of the antifuse link 130 comprises a first volume 141 with a semiconductor material and a second volume 142 with a conducting material. A second conducting material containing portion 160 of the antifuse link 130 comprises a first volume 161 with semiconductor material and a second volume 162 with the conducting material. The first portion 140 of the antifuse link 130 adjoins the cathode 110 and the second portion 160 of the antifuse link 130 adjoins the anode 120.

The cathode 110 contains a semiconductor material containing volume 111 and a conducting material containing volume 112. Similarly, the anode 120 contains a semiconductor material containing volume 121 and a conducting material containing volume 122. A contact 119 from the metal wiring to the cathode 110 and another contact 129 from the metal wiring to the cathode 120 are also shown. Areas that contain a conducting material when seen from the top and are not blocked by the contacts are hatched in FIG. 1A. Areas containing conducting material in the cross-sectional view are hatched in FIG. 1B. The conducting material may be metal silicide, such as nickel silicide, cobalt silicide, titanium silicide, tantalum silicide, or metal germanide, or an alloy of metal silicide and metal germanide. The semiconductor material may be silicon, germanium, carbon, or any alloys of these materials. Also, the semiconductor material may be doped for enhanced antifuse performance.

FIG. 2A shows a scanning electron micrograph (SEM) 200 of an intact antifuse structure according to the first embodiment of this invention. The semiconductor material in this case is boron doped polysilicon. The conducting material in this case is nickel platinum silicide, $Ni_{1-y}Pt_ySi_x$ with the value of x around or greater than 1 and the value of y around 0.05. The size of the cathode is about 1.73 microns in width and 1.40 microns in height. The size of the anode is about 0.65 microns in width and 1.70 microns in height. The antifuse link width is about 0.09 microns and the length is about 0.40 microns. The dimensions of the portion of the antifuse link without the conducting material are about 0.09 microns in width and 0.20 microns in height. Both the anode and the cathode have 4 contacts each.

FIG. 2B shows a scanning electron micrograph (SEM) 201 of a programmed antifuse structure according to the first embodiment of this invention. It is clear from the micrograph that the lower half of the antifuse link adjacent to the anode is filled with the silicide after the programming. FIG. 2A and FIG. 2B demonstrate that in the device according to the first embodiment of this invention, electromigration occurs despite the gap in the absence of a conducting material in the middle portion of the antifuse link.

In general, it is possible to induce various degrees of electromigration with correspondingly varying degrees of movement of the conducting material and post-programming resistance. This is demonstrated in FIG. 3 where the voltage bias across an antifuse is plotted in an arbitrary unit on the horizontal axis (x-axis) and the post-programming antifuse resistance in Ohms is plotted on a log scale with base 10 on the vertical axis (y-axis).

Figure 3:
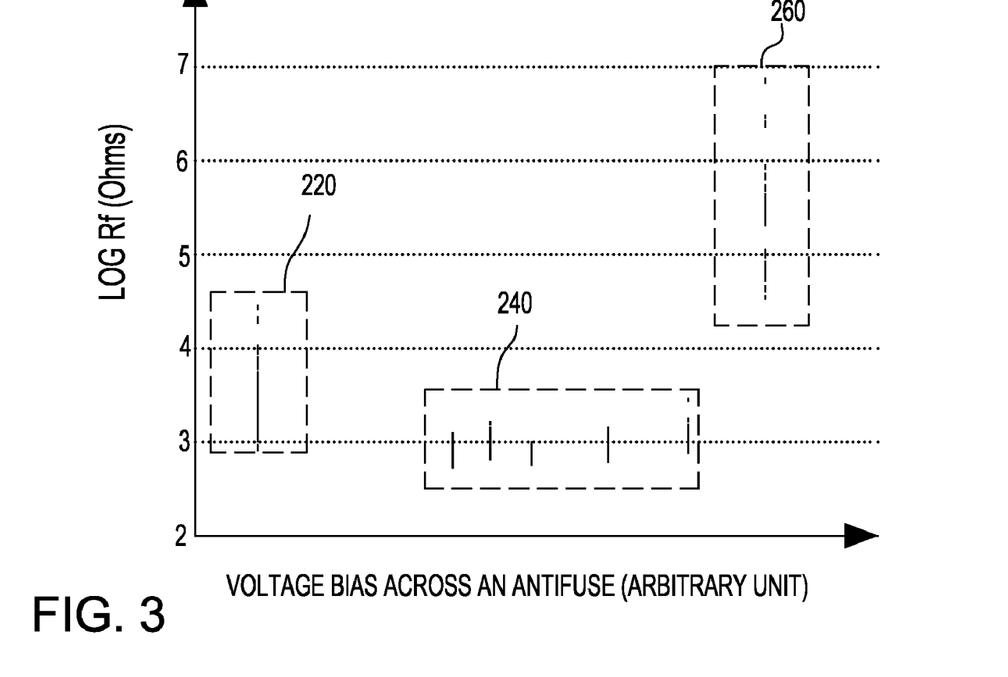
FIG. 3 is a graph of the logarithm with the base of 10 of the antifuse disclosed in the first embodiment of this invention as a function of the bias voltage across the antifuse.

FIG. 3 shows a graph in which the x-axis (horizontal axis) is the voltage bias across an antifuse in arbitrary units and the y-axis (vertical axis) is the logarithm of the measured resistance value in Ohms. Each dot in the graph corresponds to a data point from an antifuse programmed at the voltage conditions corresponding to the abscissa.

Three groups of resistance distributions are easily distinguishable. The first group 220 within the leftmost rectangle corresponds to the group of antifuses that were subjected to voltage bias conditions lower than the critical voltage needed to cause electromigration across the antifuse in the first embodiment. The resistance of these antifuses did not change since the voltage bias was too weak to cause any movement of materials resulting in a permanent change of the structure. In other words, the antifuses were not programmed when the voltage bias is under a certain critical value. In the antifuse geometry described in FIG. 2A and FIG. 2B, the critical voltage is about 1.8V.

The second group 240 within the middle rectangle corresponds to the group of antifuses that were programmed in the "weak programming mode," in other words, programmed at a voltage above the critical voltage needed to trigger electromigration, but not excessively high to trigger massive amount of electromigration or to deplete dopants from the semiconducting material. The resistance of the antifuses decreased since some conducting material electromigrated from the cathode of the antifuse into the middle portion of the antifuse link without the conducting material. Since the depleted area of the cathode where the silicide migrated from is shaped like a fan bound by two concentric semicircles with different diameters $r_1$ and $r_2$. The effective number of squares for resistance calculation purposes for such a geometry is given by $\ln(r_2/r_1)/\pi$, where ln is the natural logarithm, $r_2$ is the radius of the larger semicircle and $r_1$ is the radius of the smaller semicircle. In accordance with the present invention, the area of the middle portion of an intact antifuse link is much smaller than the area defined by the fan from which the silicide is electromigrated. However, the number of squares for the middle portion of an intact antifuse link is much greater than the effective number of squares for the fan area. Therefore, the electromigration in the weak programming mode causes an overall decrease in the resistance in the programmed antifuse structure.

The third group 260 within the rightmost rectangle corresponds to the group of antifuses that were programmed in the "strong programming mode," that is, programmed at a voltage high enough to trigger massive electromigration of materials or to cause the depletion of dopants. In this mode, the amount of the conducting material in the cathode that electromigrates is substantial enough to cause overall increase of the resistance. Alternatively, the dopants in the area without the conducting material may be depleted to cause high post-programming resistance. FIG. 2B is representative of this mode of programming. Therefore, it is possible to modulate the amount of electromigrated material to adjust the amount of the conducting material in the antifuse link.

Modulation of the antifuse resistance by electromigration requires sufficient supply of conducting material into the antifuse link to alter the state of the electrical connection. In this regard, a large cathode area is preferred. An area of the cathode that is at least as large as 5 times the area of the antifuse link is preferred to effect significant changes in the antifuse resistance through programming.

To program the antifuse 100 of the first embodiment, a positive voltage bias is applied to the anode 110 of the antifuse 100. The magnitude of the positive voltage bias is greater than the critical voltage needed to induce electromigration. If lowering of the antifuse resistance is desired, the weak programming mode is chosen and the magnitude of the voltage corresponding to that mode is applied as a pulse to the anode 110. If raising of the antifuse resistance is desired, the strong programming mode is selected and the magnitude of the voltage corresponding to that mode is applied as a pulse to the anode 110. While the description of the antifuse programming is herein described with a positive voltage pulse to the anode 110, the same result may be achieved by applying a negative voltage pulse to the cathode 120 while the anode 110 is grounded.

To sense the state of the antifuse 100 of the first embodiment, the resistance of the antifuse 100 is measured and is compared with a reference resistance corresponding to a value between the intact state and the programmed state. Depending on the state of the antifuse 100, the resistance of the antifuse 100 may be greater than or smaller than that of the reference resistance. Notice that the reference resistance may be greater or less than the intact resistance depending on the programming mode. For example, if the weak programming mode is used, the reference resistance is smaller than the resistance of an intact antifuse 100. On the other hand, if the strong programming mode is used, the reference resistance is greater than the resistance of an intact antifuse 100.

Figure 4A:
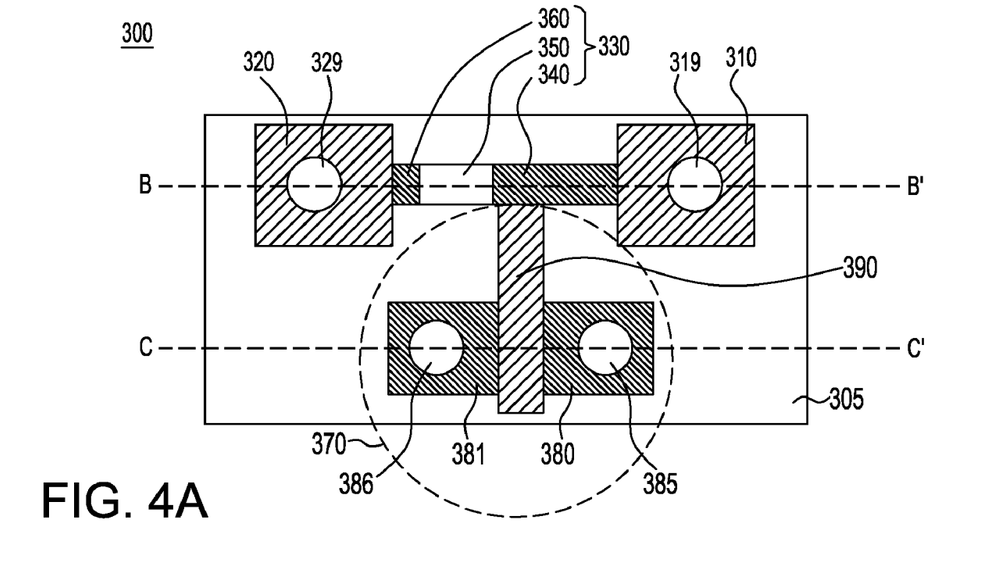
FIG. 4A is a top-down view of an intact electrical antifuse as disclosed in the second embodiment of this invention.
Figure 4B:
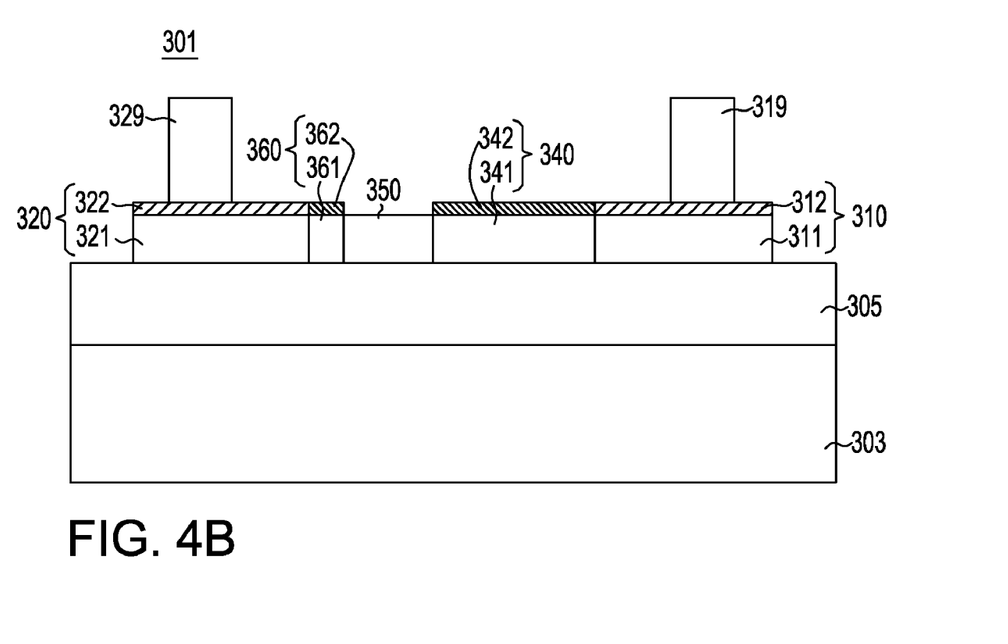
FIG. 4B is a cross-sectional view along the plane B-B' in FIG. 4A of an intact electrical antifuse as disclosed in the second embodiment of this invention.
Figure 4C:
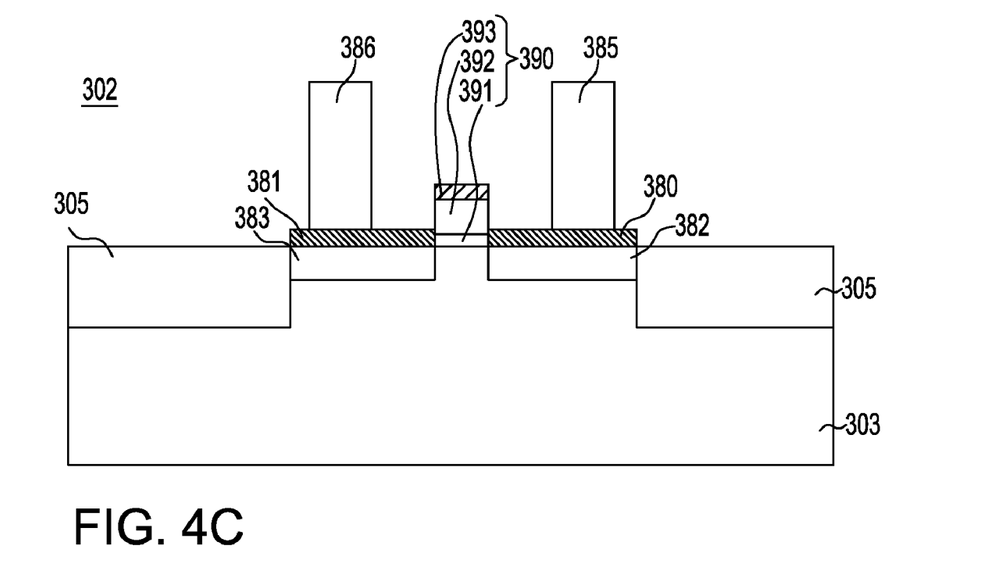
FIG. 4C is a cross-sectional view along the plane C-C' in FIG. 4A of an intact electrical antifuse as disclosed in the second embodiment of this invention.

In FIG. 4A, an intact integrated antifuse 300 with integrated sensing device 370 according to the second embodiment of this invention is shown. A cross-sectional view 301 along the line B-B' in FIG. 4A is shown in FIG. 4B and another cross-sectional view 302 along the line C-C' in FIG. 4A is shown in FIG. 4C. An antifuse link 330 is adjoined by a cathode 310 on one side and adjoined by an anode 320 on another side. A sensing device 370, that is, a transistor, is placed adjacent to the antifuse link 330 such that the gate 390 of the sensing device 370 is attached to the antifuse link 330. Preferably, the antifuse link 330, cathode 310, and anode 320 are formed on a shallow trench isolation 305 formed as an insulator on a semiconductor substrate 303.

The antifuse link 330 comprises a portion 350 without conducting material and two conducting material containing portions. A first conducting material containing portion 340 of the antifuse link 330 comprises a first volume 341 with semiconductor material and a second volume 342 with the conducting material. A second conducting material containing portion 360 of the antifuse link 330 comprises a first volume 361 with semiconductor material and a second volume 362 with the conducting material. The first portion 340 of the antifuse link 330 adjoins the cathode 310 and the second portion 360 of the antifuse link 330 adjoins the anode 320.

The cathode 310 contains a semiconductor material containing volume 311 and a conducting material containing volume 312. Similarly, the anode 320 contains a semiconductor material containing volume 321 and a conducting material containing volume 322. The gate 390 of the sensing device 370 is attached to the first conduction material containing portion 340. Preferably, the gate 390 contains a semiconductor material containing volume 391 and a conducting material containing volume 392.

The sensing device 370 is formed on a semiconductor substrate 103 and is surrounded by shallow trench isolation 305. The source 382 of the sensing device 370 is provided with conducting material 380 at the top to improve contact resistance to the contact 385. Similarly, the drain 383 of the sensing device 370 is provided with conducting material 381 at the top to improve contact resistance to the contact 386. A contact 319 from the metal wiring to the cathode 310 and another contact 329 from the metal wiring to the cathode 320 are also shown.

Areas that contain a conducting material when seen from the top and are not blocked by the contacts are hatched in FIG. 4A. Areas containing conducting material in the cross-sectional view are hatched in FIG. 4B and FIG. 4C. The conducting material may be metal silicide, such as nickel silicide, cobalt silicide, titanium silicide, tantalum silicide, or metal germanide, or an alloy of metal silicide and metal germanide. The semiconductor material may be silicon, germanium, carbon, or any alloys of these materials. Also, the semiconductor material may be doped for enhanced antifuse performance.

To program the integrated antifuse 300 of the second embodiment, a positive voltage bias is applied to the anode 310 relative to the cathode 320 of the integrated antifuse 300. The magnitude of the positive voltage bias is adjusted so that the electromigrated conducting material plugs up the portion of the antifuse link 350 that was originally filled only with the semiconducting material and creates an electrical short between the anode 320 and the gate 390 of the sensing device 390. Also, the magnitude of the positive voltage bias is selected such that sufficient amount of material is electromigrated out of the cathode 310 to create an electrical open between the cathode 310 and the gate 390 of the programming transistor 370.

Figure 5A:
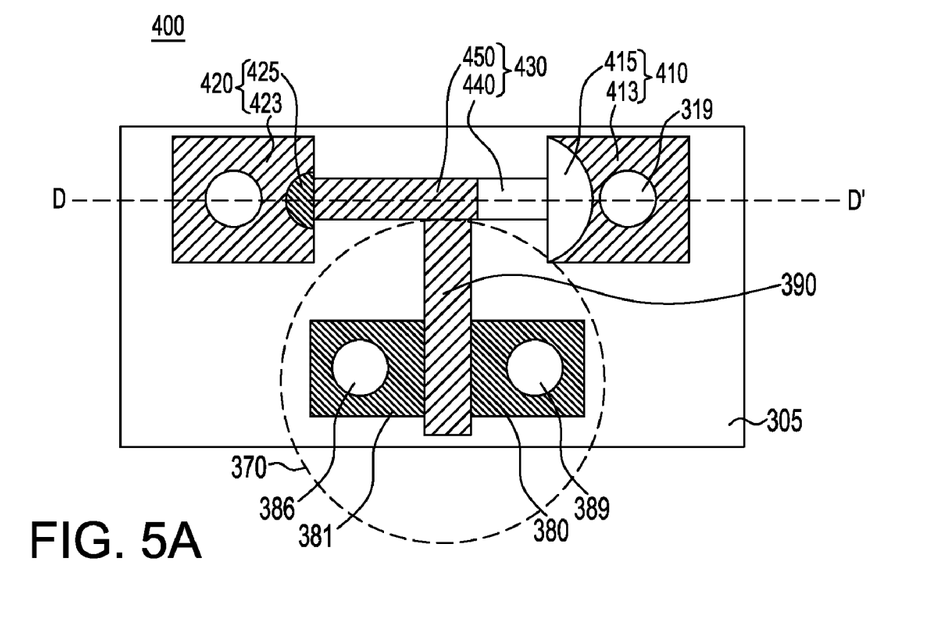
FIG. 5A is a top-down view of a programmed electrical antifuse as disclosed in the second embodiment of this invention.
Figure 5B:
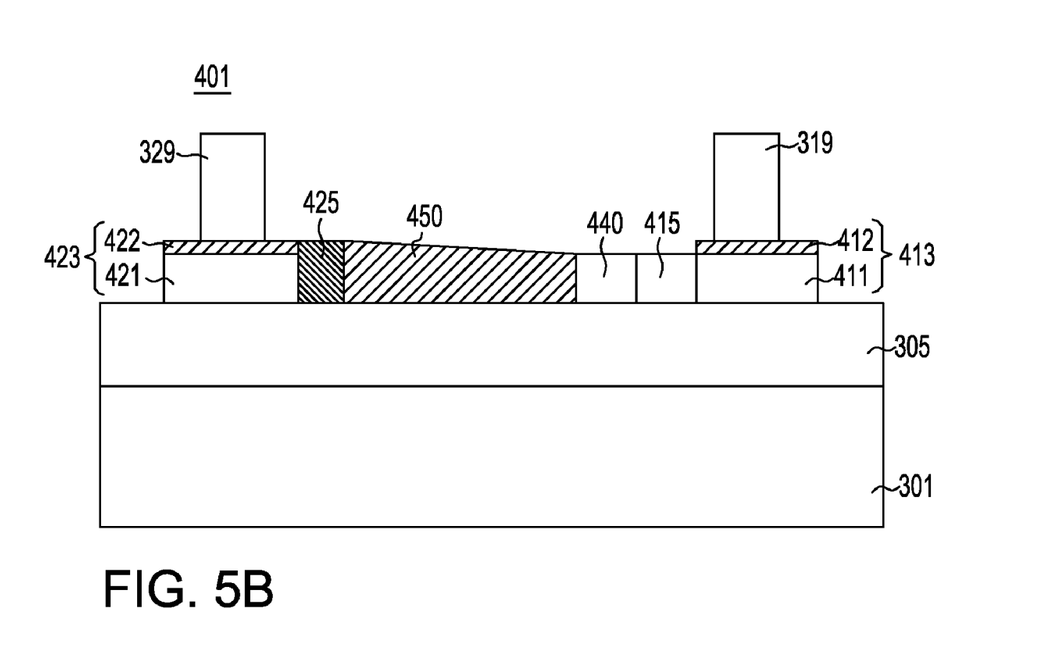
FIG. 5B is a cross-sectional view along the plane B-B' in FIG. 4A of a programmed electrical antifuse as disclosed in the second embodiment of this invention.

In FIG. 5A, a programmed integrated antifuse 400 with integrated sensing device 370 according to the second embodiment of this invention is shown. A cross-sectional view 401 along the line D-D' in FIG. 5A is shown in FIG. 5B. A portion 415 of the cathode 410 is devoid of any conducting material and consists of semiconducting material only while the rest of the cathode 413 still has a first volume 411 containing the semiconducting material and a second volume 412 containing the conducting material. The antifuse link 430 of the programmed antifuse comprises a first portion 440 without the conducting material that is adjacent to the cathode 410 and a second portion 450 containing the conducting material that is adjacent to the anode 420. The anode comprises a first portion 425 where the electromigrated conducting material accumulates and a second portion 423 containing a semiconductor material containing volume 421 and a conducting material containing volume 422.

Depending on the electromigration mechanism, the conducting material in the second portion 450 of the antifuse link 430 and the conducting material in the first portion 425 of the anode may be a mixture of the semiconducting material and the original conducting material of the intact integrated antifuse 300. In other words, the conducting material after the antifuse programming may be mixed with the semiconductor material to some degree. However, the conductivity of the conducting material even after the mixing with the semiconductor material is still very high compared to that of the semiconducting material and is practically high enough to be considered to be conducting.

In an intact integrated antifuse 300 according to the second embodiment of this invention, the gate 390 of the sensing device 370 is electrically connected to the cathode 310 while it is disconnected from the cathode 320. In the programmed antifuse 400 according to the second embodiment of this invention, the gate 390 of the sensing device 370 is electrically connected to the anode 420 it is disconnected from the cathode 410. Utilizing this change of the electrical connection to the gate 390, the state of the antifuse with integrated sensing device can be sensed. Specifically, the source 382 of the sensing device 370 is connected to ground. The drain 383 of the sensing device 370 is connected to a positive power supply. If the anode 320 of the intact integrated antifuse 300 is connected to a positive bias voltage and the cathode 310 of the intact integrated antifuse 300 is connected to the ground, an intact integrated antifuse 300 will not turn on the sensing device 370 and thus, the current through the circuit containing the sensing device will be shut off by the sensing device 370. However, if the anode 420 of the programmed antifuse 400 is connected to a positive bias voltage and the cathode 410 of the programmed antifuse 400 is connected to the ground, a programmed integrated antifuse 400 will turn on the sensing device 370 and thus allow the current flow through the sensing device 370.

Figure 6:
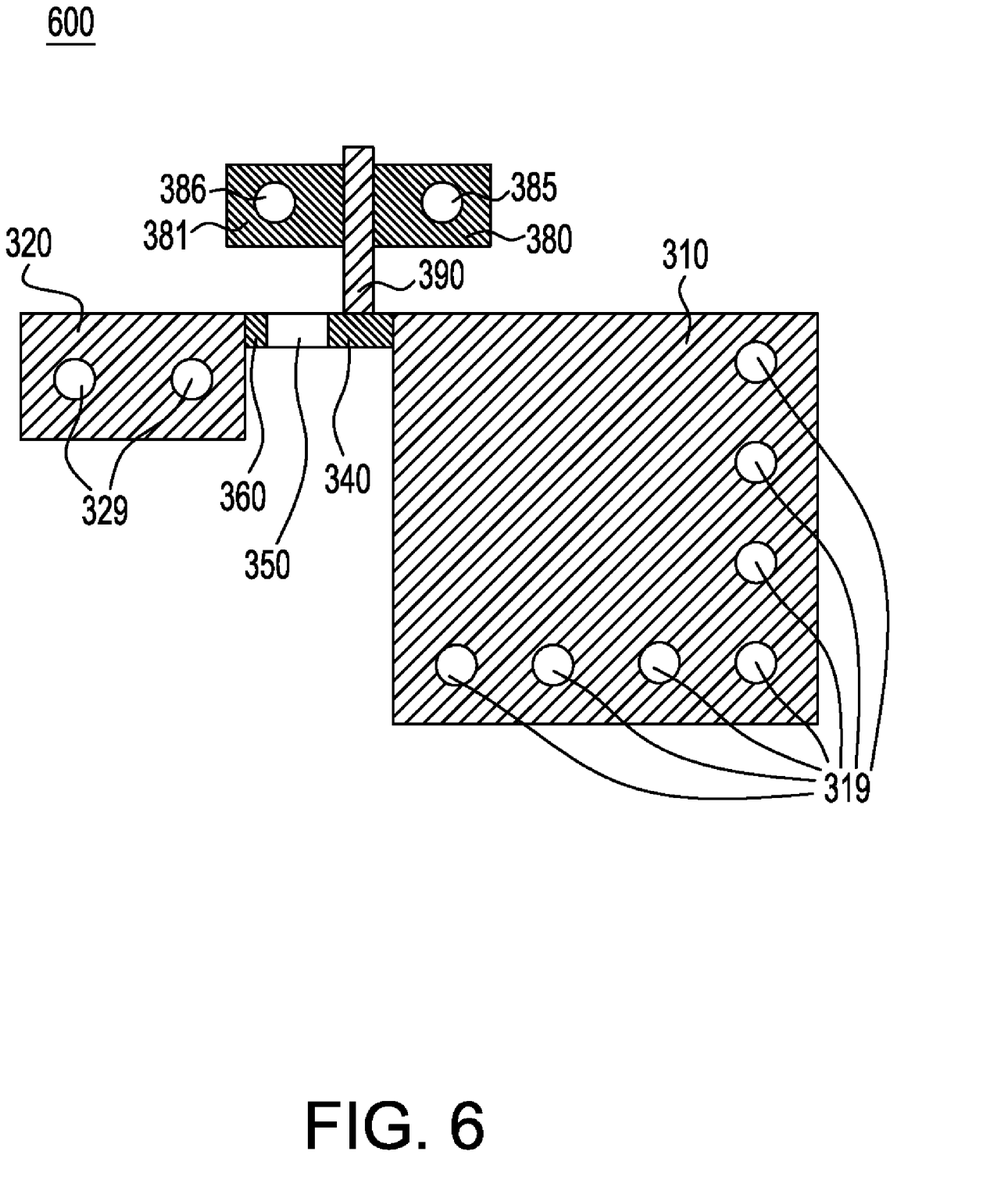
FIG. 6 is a top-down view of an intact electrical antifuse with modified arrangement of components as disclosed in the second embodiment of this invention.

A modified arrangement 600 of components of an antifuse with integrated sensing device according to the second embodiment of this invention is shown in FIG. 6. The size of the cathode, the size of the anode, the size of the antifuse link, the size and the location of the portion of the antifuse link without the conducting material can be altered to improve performance. Also, the number of contacts to the cathode 310, to the anode 320, and the size of the sensing device may be optimized to improve performance.

Figure 7A:
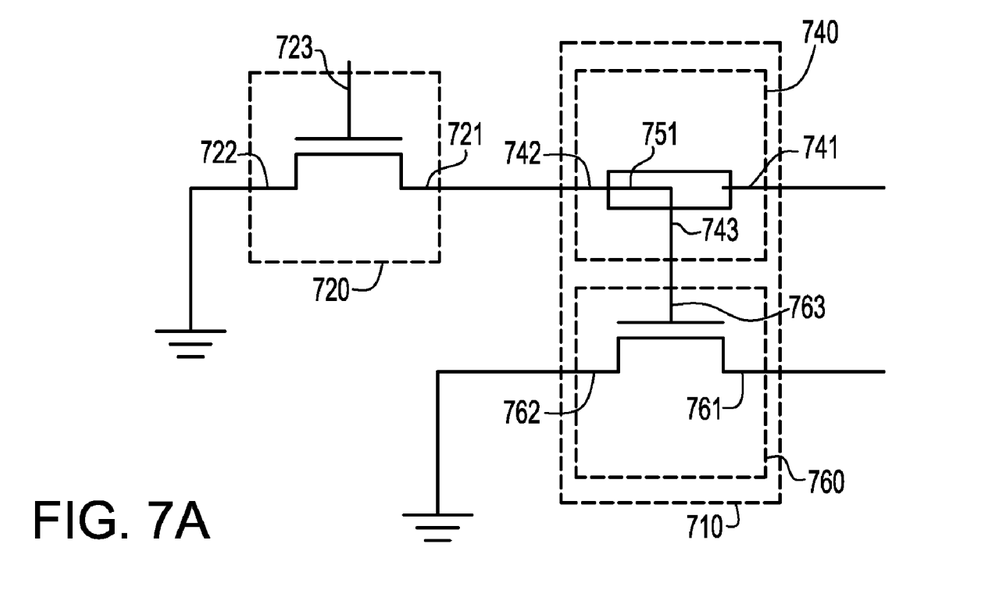
FIG. 7A is a diagram of an intact electrical antifuse as disclosed in the second embodiment in a series connection with a programming transistor.

FIG. 7A is a diagram of a circuit containing a programming transistor 720 and an intact integrated antifuse 770. The programming transistor 720 comprises a source 722, a drain 721, and a gate 723. The intact integrated antifuse 770 comprises an intact antifuse structure 740 and a sensing device 760. The intact antifuse structure 740 comprises a cathode 742, an anode 741, and a connection 743 to the sensing device 760. The sensing device 760 comprises a source 762, a drain 761, and a gate 763. The gate 763 of the sensing device 760 is electrically connected to the connection 743 of the intact antifuse structure 740. FIG. 4A corresponds to a physical implementation of the circuit in FIG. 7A. Physically, the connection 743 of the intact antifuse structure 740 is the interface between the antifuse link 330 and the gate 390 of the sensing device 370 in FIG. 4A. Also, physically, the gate 763 in FIG. 7A is the gate 390 of the sensing device 370 in FIG. 4A. The state of the intact antifuse structure 770 is described by the presence of the electrical connection 749 between the cathode 742 and the gate 763 and by the absence of electrical connection between the anode 741 and the gate 763.

Figure 7B:
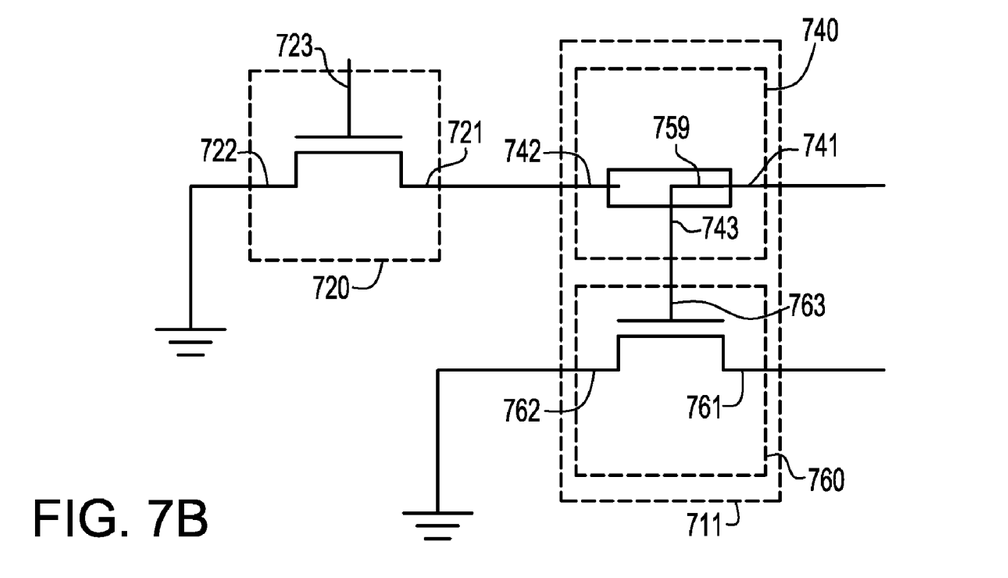
FIG. 7B is a diagram of a programmed electrical antifuse as disclosed in the second embodiment in a series connection with a programming transistor.

FIG. 7B is a diagram of a circuit containing a programming transistor 720 and a programmed integrated antifuse 771. The programming transistor 720 comprises a source 722, a drain 721, and a gate 723. The programmed integrated antifuse 771 comprises a programmed antifuse structure 750 and a sensing device 760. The programmed antifuse structure 750 comprises a cathode 742, an anode 741, and a connection 743 to the sensing device 760. The sensing device 760 comprises a source 762, a drain 761, and a gate 763. The gate 763 of the sensing device 760 is electrically connected to the connection 743 of the programmed antifuse structure 740. FIG. 5A corresponds to a physical implementation of the circuit in FIG. 7B. Physically, the connection 743 of the programmed antifuse structure 750 is the interface between the antifuse link 330 and the gate 390 of the sensing device 370 in FIG. 5A. Also, physically, the gate 763 in FIG. 7B is the gate 390 of the sensing device 370 in FIG. 5A. The state of the programmed antifuse structure 771 is described by the presence of the electrical connection 759 between the anode 741 and the gate 763 and by the absence of electrical connection between the cathode 742 and the gate 763.

Figure 8:
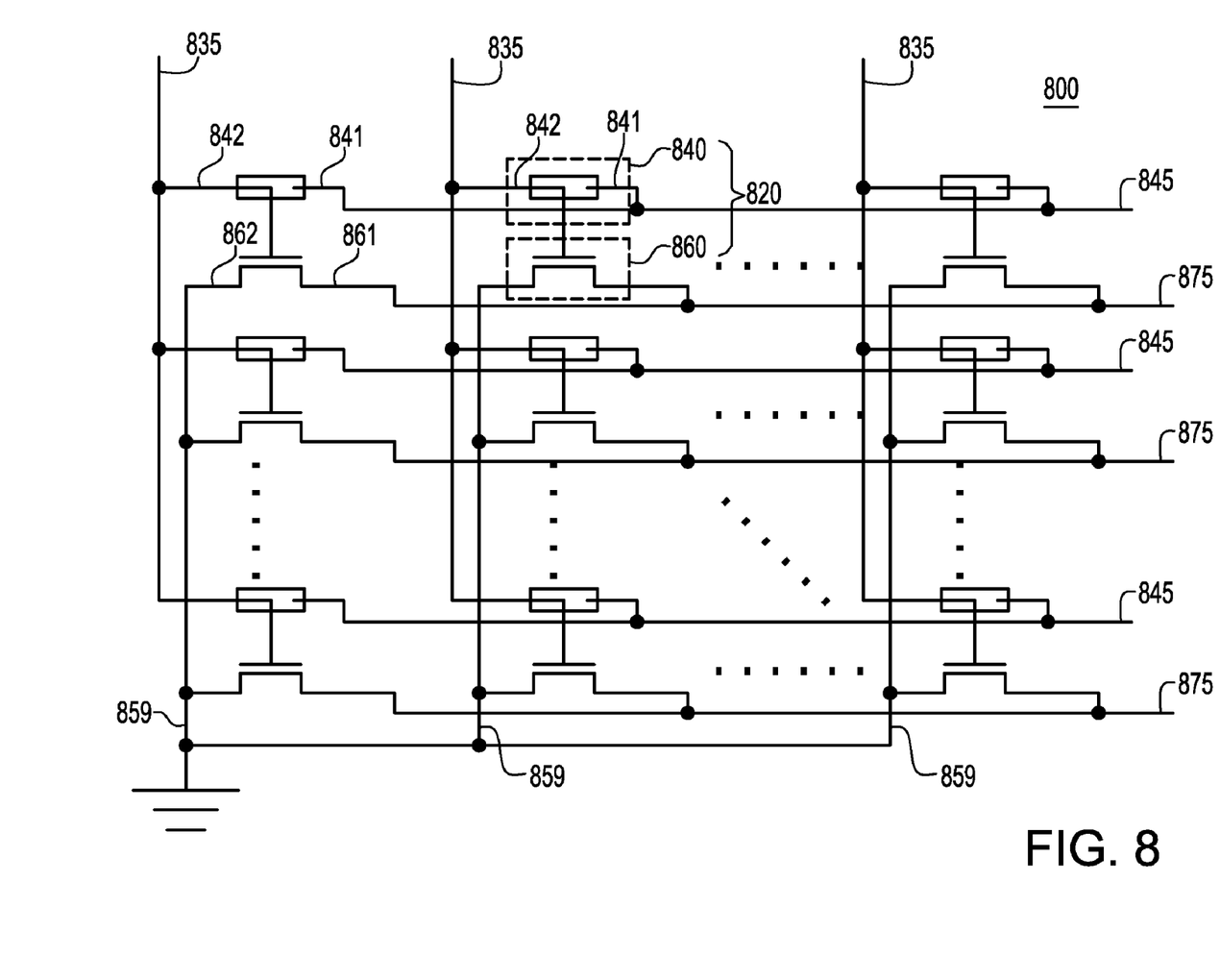
FIG. 8 is a diagram illustrating the arrangement of antifuses with integrated sensing devices in an array environment as disclosed in the third embodiment of this invention.

According to a third embodiment of this invention, integrated antifuses 820 are wired in a two-dimensional integrated antifuse array 800 and share programming transistors and sensing circuitry in the periphery. Each of the integrated antifuses 820 has one antifuse structure 840 and one sensing device 860. The cathode 842 of each antifuse structure 840 is connected to one of the column antifuse wiring lines 835 that pass by the same antifuse structure 840. The anode 841 of each antifuse structure 840 is connected to one of the row antifuse wiring lines 845 that pass by the same antifuse structure 840. The drain 861 of each sensing device 860 is connected to one of the sensing device wiring lines 875. The source 862 of each sensing device 860 is connected to one of the column grounding bus 859 and is eventually connected to the ground.

Programming of the antifuses in the third embodiment of this invention proceeds as follows. All column antifuse wiring lines 835 and all row antifuse wiring lines 845 are sent to a high impedance state so that they do not provide paths for electrical conduction of current. All row antifuse wiring lines 845 may alternatively be grounded. Also, all row sensing device wiring lines 875 are grounded or alternatively kept at a constant voltage that would not induce excessive leakage current through the gates of the sensing devices 860. Thereafter, one integrated antifuse to be programmed is selected from among the integrated antifuses 820 in the two-dimensional integrated antifuse array 800.

Once one integrated antifuse is chosen for programming, a positive voltage bias is applied to the row antifuse wiring line corresponding to the selected antifuse to provide sufficient electrical bias to the anode of the selected integrated antifuse. One of the column antifuse wiring lines 835 corresponding to the selected antifuse is then connected to ground for a time interval which is sufficiently long to cause the programming of the selected antifuse, i.e., the connection between the cathode and the ground is "pulsed." Notice that as long as there is sufficient magnitude of relatively positive voltage bias on the anode of the selected integrated antifuse compared to the cathode of the same integrated antifuse, the programming of the antifuse will proceed irrespective of the absolute level of voltages applied to the cathode or anode. It is also possible to program the antifuses by connecting the cathode of the selected antifuse to the ground first and then by pulsing the connection between the positive power supply and the anode. The programming of the antifuses is performed one at a time until all the antifuses intended for programming are programmed.

The sensing of the antifuses is performed by grounding all row antifuse wiring lines 845 and all column antifuse wiring lines 835. A low positive voltage is applied to one of the column antifuse wiring lines 845. The rest of the column selected wiring lines are put in a high impedance state that does not provide any electrical conduction path, or alternatively, connected to the ground. The magnitude of the low positive voltage is such that it would be able to turn on the sense transistors 860 if applied to their gates but is not sufficient to cause any permanent structural changes in the integrated antifuses 840 through high current, for example, by causing electromigration or rupture inside the integrated antifuses. Obviously, the magnitude of the low positive voltage for sensing is lower than the positive voltage bias used during the programming of antifuses. The row sensing device wiring lines 875 are supplied with a positive bias voltage during sensing of the antifuses. When the low positive voltage is applied to the selected column antifuse wiring lines 835, a voltage differential exists between the cathode and the anode of each antifuse connected to the selected column antifuse wiring line.

Depending on whether each antifuse is programmed or intact, the voltage on the gate of the sensing device connected to each antifuse will be either low or high because the voltage division inside the antifuse link of the antifuse depends on the physical structure of the antifuse. Specifically, if an antifuse is intact, the structure of the antifuse link is as shown in the integrated antifuse 300 in FIG. 4A, causing the gate of the sensing device to be at a voltage close to the ground level and turning the sensing device off. If an antifuse is programmed, the structure of the antifuse link is as shown in the device 400 in FIG. 5A, causing the gate of the sensing device to be at a voltage close to the supplied low positive voltage bias and turning the sensing device on. Therefore, depending on the state of the antifuse connected to the selected column antifuse wiring line, the row sensing device wiring lines 875 conducts different levels of current, which can then be used to determine the state of the antifuses on the selected column antifuse wiring line. Notice that the states of all antifuses connected to the same column antifuse wiring line may be sensed simultaneously.

Figure 9:
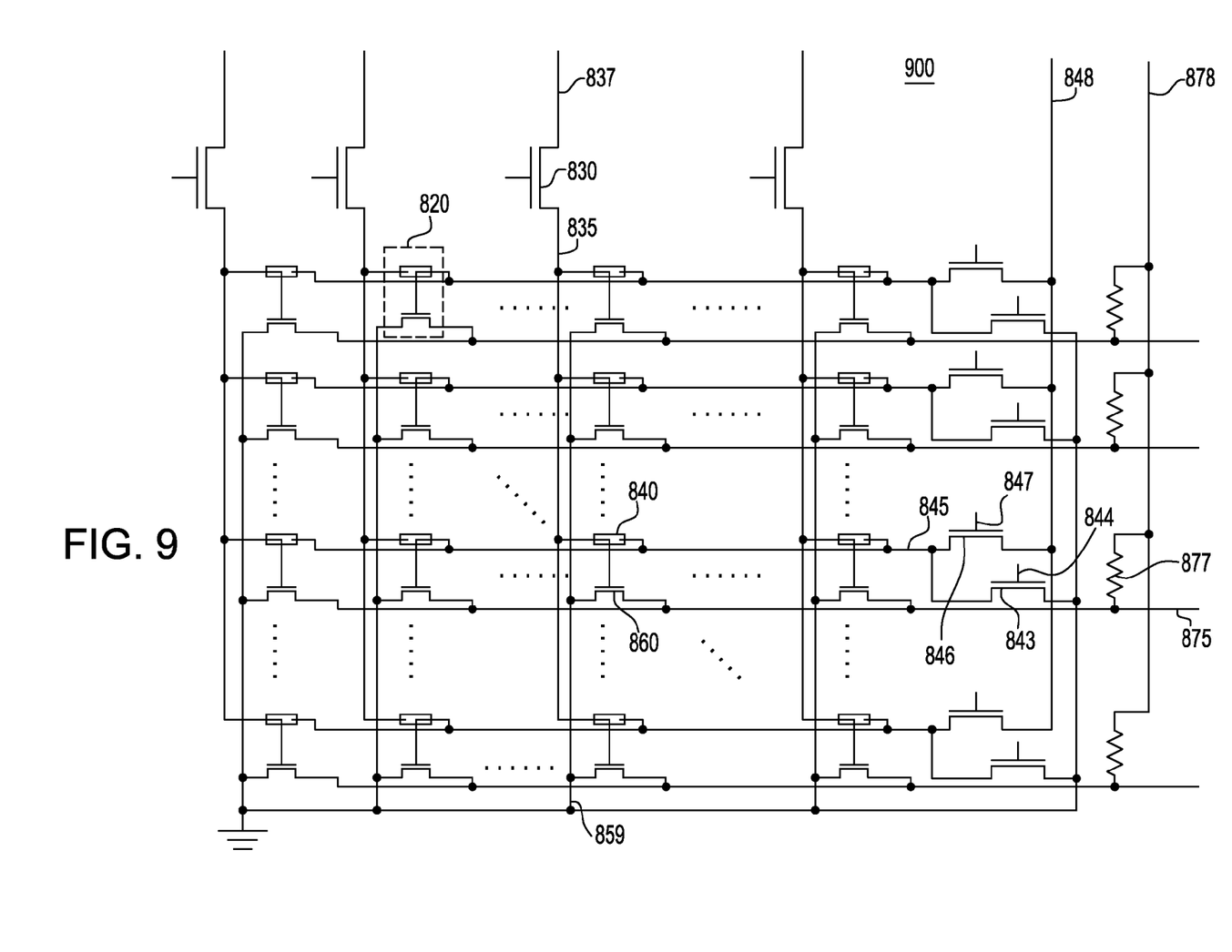
FIG. 9 is a diagram illustrating the arrangement of antifuses with integrated sensing devices in an array environment as well as peripheral circuitry including the column select transistors, the programming row enable transistors, the row grounding transistors, and resistors.

FIG. 9 shows a two-dimensional integrated antifuse array 900 with peripheral circuitry incorporating transistors to control the biasing of various wiring. Intact and programmed antifuses are intentionally mixed in FIG. 9 to demonstrate a partially programmed two-dimensional integrated antifuse array 900 with peripheral circuitry. Each of the column antifuse wiring lines 835 is connected to one of the column select transistors 830. All the column select transistors 830 are connected to the column bias supply lines 837, which are electrically connected to the ground during programming but are electrically connected to a positive voltage source during sensing. Alternatively, two transistors may replace each one of the column select transistors 830, where one transistor serves as a switch to the ground while the other serves as a switch to the positive voltage source. Each of the row antifuse wiring line 845 is connected both to one of the row grounding transistors 843 and to one of the programming row enable transistors 846. All row grounding transistors 843 are connected to the ground while all programming row enable transistors 846 are connected to the programming voltage supply 848. The sensing device wiring lines 875 are connected to the sensing circuitry power supply 878 through one of the sensing resistors 877. Alternative sensing circuitry designs where the sensing resistors 877 are replaced with transistors or other passive circuit components are also possible.

During the programming of an antifuse, one of the column select transistors 830 provide ground voltage to the selected column antifuse wiring line. The rest of the column select transistors 830 are turned off to isolate the rest of the column antifuse wiring lines 835. Initially, all row antifuse wiring lines 845 are connected to the ground through the row grounding transistors 843 by providing a positive voltage to their gates 844 while the programming row enable transistors 846 are all turned off by grounding their gates 847. Then the row grounding transistor that is connected to the selected antifuse to be programmed is turned off. Thereafter, the row antifuse wiring line that is connected to the selected antifuse to be programmed is connected to the programming voltage supply 848 through the programming row enable transistor connected to that row. The antifuse is programmed by pulsing the gate voltage of the programming row enable transistor that is attached to the selected antifuse. Alternatively, the programming sequence can be revised to pulse one of the column select transistors 830 instead of one of the row enable transistors 846.

During the sensing of the two-dimensional integrated antifuse array 900 with peripheral circuitry, the column bias supply lines 837 is biased with a positive sense bias voltage that is high enough to turn on any of the sensing devices 860. One of the column select transistors 830 turns on to provide the positive sense bias voltage to one of the column antifuse wiring lines 835. The rest of the column select transistors 830 are turned off at this point. In an alternate implementation where two transistors replace each one of the column select transistors 830, where one transistor serves as a switch to the ground while the other serves as a switch to the positive voltage source, only one of the column antifuse wiring lines 835 are biased at the positive sense bias voltage while the rest of the column antifuse wiring lines 835 are grounded. All the row antifuse wiring lines 845 are connected to the ground through the row grounding transistors 843 that are turned on during the sensing operation. All programming row enable transistors 846 are all turned off during sensing.

Since only one of the column antifuse wiring lines 835 is biased while the rest of the column antifuse wiring lines 835 are grounded either indirectly through the antifuses or directly through transistors in an alternate implementation, only the integrated antifuses 820 on the biased column antifuse wiring line can cause any current flow through their sensing devices. Furthermore, the positive sense bias voltage can be applied to the gate of the sensing devices 860 and turn it on only if the antifuse is intact to enable an electrical connection between the cathode 842 and the gate of the associated sensing device. In programmed antifuses, the gate of the sensing device is still connected to the ground through the anode 841. Therefore, depending on the state of the integrated antifuse 820, the associated sensing device does or does not provide a current path. By connecting a circuit element, for example, resistors 877 as shown in FIG. 9, the presence or absence of the current is converted to a voltage output for sensing of the two dimensional antifuse array 900 with peripheral circuitry.

While all the disclosed embodiments of the antifuses and antifuse arrays were described as a structure on a bulk substrate, implementation of these on silicon on insulator (SOI) substrate is straightforward.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A two-dimensional semiconductor structure array, comprising:
   a plurality of integrated antifuses in a row and column arrangement;
   a plurality of column antifuse wiring lines;
   a plurality of row antifuse wiring lines; and
   a plurality of row sensing device wiring lines,
   wherein each one of said integrated antifuses further includes an antifuse link, a cathode, an anode, a sensing device including a gate, a source, and a drain, wherein said gate is connected to a portion of said antifuse link, and means for delivering current through said anode, said antifuse link, and said cathode.

2. The two-dimensional semiconductor structure array of claim 1, wherein each of said plurality of column antifuse wiring lines connects said cathodes of said integrated antifuses in the same column, each of said plurality of row antifuse wiring lines connects said anodes of said integrated antifuses in the same row, and each of said plurality of row sensing device wiring lines connects said drains of said sensing devices in the same row.

3. The two-dimensional semiconductor structure array of claim 1, wherein each of said antifuse link includes:
a first portion comprising a first semiconducting material;
a second portion comprising a second semiconducting material and a first conducting material, wherein said second semiconducting material abuts said first semiconducting material, and wherein said first conducting material overlaps the entirety of said second portion of said antifuse link; and
a third portion comprising a third semiconducting material and a second conducting material, wherein said third semiconducting material abuts said first semiconducting material and does not abut said second portion, and wherein said second conducting material overlaps the entirety of said third portion of said antifuse link,
wherein said cathode comprises a fourth semiconducting material and a third conducting material and abuts said second portion, wherein said third conducting material overlaps the entirety of said cathode.

4. The two-dimensional semiconductor structure array of claim 3, wherein said anode comprises a fifth semiconducting material and a fourth conducting material and abuts said third portion and does not abut said cathode.

5. The two-dimensional semiconductor structure array of claim 4, wherein said first conducting material overlaps the entirety of said second portion of said antifuse link, said second conducting material overlaps the entirety of said third portion of said antifuse link, said third conducting material overlaps the entirety of said cathode, and said fourth conducting material overlaps the entirety of said anode.

6. The two-dimensional semiconductor structure array of claim 3, wherein said first, second, and third conducting materials comprise a metal silicide, a metal germanide, or a mixture of a metal silicide and a metal germanide, and said first, second, third, and fourth semiconducting materials are made of undoped silicon, doped silicon, undoped germanium, doped germanium, undoped alloy of silicon germanium, doped silicon germanium alloy, undoped silicon carbon alloy, doped silicon carbon alloy, undoped silicon germanium carbon alloy, or doped silicon germanium carbon alloy.

7. The two-dimensional semiconductor structure array of claim 1, further comprising an insulator formed on a semiconductor substrate, said insulator located beneath said cathode, said antifuse link, and said anode.

8. A semiconductor structure, comprising:
an antifuse link, which includes:
a first portion made of a first semiconducting material;
a second portion made of a second semiconducting material and a first conducting material, of which said second semiconducting material adjoins said first semiconducting material; and
a third portion made of a third semiconducting material and a second conducting material, of which said third semiconducting material adjoins said first semiconducting material, and does not adjoin said second portion;
a cathode comprising a fourth semiconducting material and a third conducting material, said cathode adjoining said second portion;
an anode comprising a fifth semiconducting material and a fourth conducting material, said anode adjoining said third portion but not adjoining said cathode; and
a sensing device including a gate, a source, and a drain, wherein said gate is connected to said third portion of said antifuse link.

9. The semiconductor structure of claim 8, wherein
said first conducting material overlaps the entirety of said second portion of said antifuse link;
said second conducting material overlaps the entirety of said third portion of said antifuse link;
said third conducting material overlaps the entirety of said cathode; and
said fourth conducting material overlaps the entirety of said anode.

10. The semiconductor structure of claim 8, wherein each of said first, second, third, and fourth conducting materials comprises a metal silicide, a metal germanide, or a mixture of a metal silicide and a metal germanide.

11. The semiconductor structure of claim 8, wherein each of said first, second, third, fourth, and fifth semiconducting materials is made of undoped silicon, doped silicon, undoped germanium, doped germanium, undoped alloy of silicon germanium, doped silicon germanium alloy, undoped silicon carbon alloy, doped silicon carbon alloy, undoped silicon germanium carbon alloy, or doped silicon germanium carbon alloy.

12. The semiconductor structure of claim 8, wherein the area of said cathode exceeds 5 times the area of said first portion of said antifuse link.

13. The semiconductor structure of claim 8, further comprising means for delivering current through said anode, said antifuse link, and said cathode.

14. A semiconductor structure, comprising:
an antifuse link, which includes:
a first portion made of a first semiconducting material;
a second portion made of a second semiconducting material and a first conducting material, of which said second semiconducting material adjoins said first semiconducting material; and
a third portion made of a third semiconducting material and a second conducting material, of which said third semiconducting material adjoins said first semiconducting material, and does not adjoin said second portion;
a cathode comprising a fourth semiconducting material and a third conducting material, said cathode adjoining said second portion;
an anode comprising a fifth semiconducting material and a fourth conducting material, said anode adjoining said third portion but not adjoining said cathode;
a sensing device including a gate, a source, and a drain, wherein said gate is connected to said third portion of said antifuse link; and
means for delivering current through said anode, said antifuse link, and said cathode.

15. The semiconductor structure of claim 14, where
said first conducting material overlaps the entirety of said second portion of said antifuse link;
said second conducting material overlaps the entirety of said third portion of said antifuse link;
said third conducting material overlaps the entirety of said cathode; and
said fourth conducting material overlaps the entirety of said anode.

16. The semiconductor structure of claim 14, where each of said first, second, third, and fourth conducting materials comprises a metal silicide, a metal germanide, or a mixture of a metal silicide and a metal germanide.

17. The semiconductor structure of claim 14, where each of said first, second, third, fourth, and fifth semiconducting materials is made of undoped silicon, doped silicon, undoped germanium, doped germanium, undoped alloy of silicon germanium, doped silicon germanium alloy, undoped silicon carbon alloy, doped silicon carbon alloy, undoped silicon germanium carbon alloy, or doped silicon germanium carbon alloy.

18. The semiconductor structure of claim 14, where the area of said cathode exceeds 5 times the area of said first portion of said antifuse link.

19. The semiconductor structure of claim 14, where
said cathode is provided with contacts; and
said anode is provided with contacts.

20. The semiconductor structure of claim 14, further comprising an insulator formed on a semiconductor substrate, said insulator located beneath said cathode, said antifuse link, and said anode.

* * * * *